United States Patent
Franklin et al.

(10) Patent No.: US 6,507,370 B1
(45) Date of Patent: Jan. 14, 2003

(54) HIGHLY ADJUSTABLE VIDEO COMPOSITE SYNC SEPARATOR AND VARIABLE GAIN PIXEL CLOCK FREQUENCY LOCKING APPARATUS AND METHOD

(75) Inventors: Dennis E. Franklin, Endicott, NY (US); Stanley J. Kolodziejski, Endicott, NY (US); Anthony L. Simenkiewicz, Endicott, NY (US); Michael P. Vachon, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/528,953

(22) Filed: Mar. 20, 2000

(51) Int. Cl.$^7$ .............................. H04N 5/08; H03L 7/00
(52) U.S. Cl. ....................... 348/540; 348/537; 348/518; 348/533
(58) Field of Search .................................. 348/525, 528, 348/529, 530, 531, 533, 536, 537, 540, 541, 512, 518, 510; H04N 5/08

(56) References Cited

U.S. PATENT DOCUMENTS

| | | | |
|---|---|---|---|
| 4,018,990 A | * | 4/1977 | Long et al. .................. 348/506 |
| 4,038,683 A | | 7/1977 | Thorpe et al. |
| 4,490,741 A | * | 12/1984 | Hornback ................... 348/550 |
| 4,498,103 A | | 2/1985 | Aschwanden |
| 4,639,780 A | * | 1/1987 | Willis ......................... 327/141 |
| 4,697,207 A | | 9/1987 | Lilley |
| 4,751,565 A | | 6/1988 | Emmons et al. |
| 4,768,083 A | | 8/1988 | Romesburg |
| 4,908,942 A | | 3/1990 | Collins |
| 5,155,595 A | | 10/1992 | Robison |
| 5,185,603 A | * | 2/1993 | Medin ......................... 345/213 |
| 5,367,338 A | | 11/1994 | Rothermel et al. |
| 5,440,593 A | | 8/1995 | Leone |
| 5,717,469 A | * | 2/1998 | Jennes et al. ............... 348/525 |
| 5,748,252 A | | 5/1998 | Draves |
| 5,801,789 A | | 9/1998 | Zeidler et al. |
| 5,835,155 A | | 11/1998 | Jennes et al. |
| 6,008,858 A | | 12/1999 | Swan et al. |

OTHER PUBLICATIONS

IBM Technical Disclosure Bulletin, High Speed Programmable Clock Generator, vol. 27, No. 4B, Sep. 1984; pp. 2509 and 2510.

* cited by examiner

*Primary Examiner*—Michael H. Lee
(74) *Attorney, Agent, or Firm*—Schmeiser, Olsen & Watts; William H. Steinberg

(57) ABSTRACT

An apparatus and method for extracting vertical (V-SYNC) and horizontal (H-Blank) sync signals from a digital composite sync signal (C-SYNC) of a master video source for use in controlling a second video source, which allows for an adjustable delay relationship between the C-SYNC from the master source and the generated H-Blank. The present invention also provides a system and method for varying the responsiveness or gain of the genlocking circuit used to synchronize the system pixel clock frequency of the second video source to that of the master video signal.

19 Claims, 3 Drawing Sheets

HIGHLY ADJUSTABLE VIDEO COMPOSITE SYNC SEPARATOR AND VARIABLE GAIN PIXEL CLOCK FREQUENCY LOCKING APPARATUS AND METHOD

BACKGROUND OF THE INVENTION

1. Technical Field

The present invention relates generally to a digital video system. In particular, the present invention relates to an apparatus and method for extracting vertical and horizontal synchronization signals from a digital composite synchronization signal.

2. Related Art

In certain video applications, it is often necessary to align an external (or master) video source with an internal second video source such that the two video sources operate at the same pixel clock frequency, and utilize common vertical and horizontal synchronization (sync) timings.

A digital video sync separator can be used to extract vertical (V-SYNC) and horizontal (H-Blank) sync signals from a digital composite sync signal (C-SYNC) of one video source (master) for use in controlling a second video source. Different applications and system configurations, however, may require different delay relationships (due, e.g., to varying latency in the secondary video path) between the composite video signal (C-SYNC) of the master video source and the generated horizontal (H-Blank) and vertical (V-SYNC) sync signals used to synchronize the second video source. To address the problem of a variable delay relationship between C-SYNC and H-Blank, a fixed delay is often inserted in the H-Blank and V-SYNC signals between the sync separator and the second video source. This fixed delay solution, however, does not provide the flexibility required to adjust to changing application requirements or alternate system configurations.

A need therefore exists to be able to control this delay relationship in a programmable fashion to allow for adjustment based on specific application requirements and system configurations.

A digital genlocking circuit (i.e., a circuit for the synchronization of one or more signals to another signal) can be used to adjust the pixel clock frequency of the system creating the second video stream, such that it is operating at the same frequency as the master composite video source. Known genlocking circuits often establish this fixed relationship by generating a control signal (e.g., a control voltage) based on the phase relationship (or delay) between the two events that are to be synchronized, and using the control voltage to feed a charge pump that directly controls a voltage controlled oscillator (VCXO). Variability in the responsiveness of such a genlocking device, however, may be desirable. For example, when the master video source is noisy, and the extracted composite sync signal exhibits some degree of jitter, a slower reacting adjustment to the VCXO control signal is desirable to dampen the resultant jitter in the second video signal. Similarly, when the master video signal is extremely stable, a quick reacting VCXO control signal will allow a very precise lock to the master frequency. To address the VCXO control voltage gain adjustment, previous solutions often involve changing the cutoff frequency of an RC filter on the input of the VCXO. Unfortunately, this has limited flexibility, requiring the changing of either the R or C value (or both) of the RC filter.

A need therefore exists for a degree of programmable variable gain in the genlocking circuit such that the responsiveness of the control to the VCXO may be selected based on the stability of the master video source or other criteria.

SUMMARY OF THE INVENTION

The present invention provides an apparatus and method for extracting V-SYNC and H-Blank signals from a digital composite sync signal (C-SYNC) (e.g., a master video source), which allows for an adjustable delay relationship between the C-SYNC from the master source and the generated H-Blank. The present invention also provides a system and method for varying the responsiveness or gain of the genlocking circuit used to synchronize the system pixel clock frequency of the second video source to that of the master video signal.

Generally, the present invention provides an apparatus comprising:

a first video source for providing a composite sync signal (C-SYNC);

a sync separator for extracting a horizontal sync signal (H-Blank) and a vertical sync signal (V-SYNC) from C-SYNC;

a system for measuring a delay between an edge of C-SYNC and H-Blank;

a comparator for comparing the measured delay with a programmable target delay value;

a pixel clock system for generating a pixel clock signal for a second video source, the second video source additionally receiving H-Blank and V-SYNC; and a system for programmably controlling a duty cycle and effective gain of a digital signal provided to the pixel clock system, based on the comparison result provided by the comparator.

In addition, the present invention provides a method including the steps of:

providing a composite sync signal (C-SYNC) from a first video source;

extracting a horizontal sync signal (H-Blank) and a vertical sync signal (V-SYNC) from C-SYNC;

measuring a delay between an edge of C-SYNC and H-Blank;

comparing the measured delay with a programmable target delay value;

generating a pixel clock signal for a second video source, the second video source additionally receiving H-Blank and V-SYNC; and programmably controlling a duty cycle and effective gain of a digital signal provided to the pixel clock system, based on the result of the comparison step.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 1:
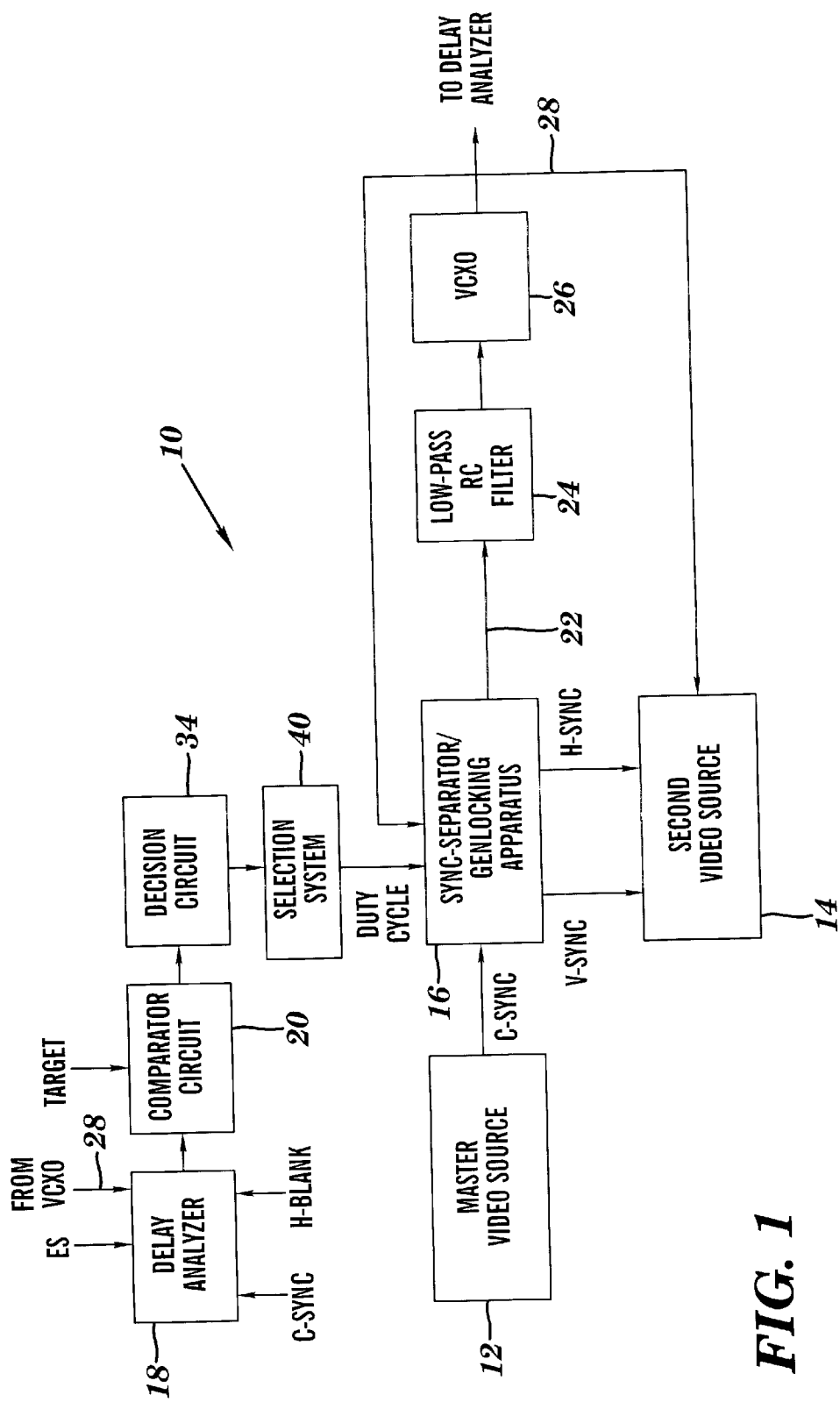
FIG. 1 illustrates an apparatus for extracting vertical (V-SYNC) and horizontal (H-Blank) sync signals from a digital composite sync signal (C-SYNC) of a master video source for use in controlling a second video source, in accordance with a preferred embodiment of the present invention.

FIG. 1 illustrates an apparatus 10 for extracting vertical (V-SYNC) and horizontal (H-Blank) sync signals from a digital composite sync signal (C-SYNC) of a master video source 12 for use in controlling a second video source 14 in accordance with a preferred embodiment of the present invention. In particular, a C-SYNC signal from the master video source 12 is provided to a SYNC-separator/ genlocking apparatus 16. The V-SYNC and H-Blank signals are extracted from the C-SYNC signal by the SYNC-separator/genlocking apparatus 16 using methods known in the art.

Once the H-Blank signal has been extracted from the C-SYNC signal by the SYNC-separator/genlocking apparatus 16, the delay (phase relationship) between an edge (leading or trailing) of the C-SYNC signal and the extracted H-Blank signal is determined in a delay analyzer 18. The delay measurement is then compared in a comparator circuit 20 with a programmable delay target value, and the result of the comparison is used to either increase or decrease the duty cycle and effective gain of a digital pulse train 22 that is used to drive the low pass RC filter 24 feeding a voltage controlled oscillator (VCXO) 26. The VCXO 26 generates a pixel clock signal 28 that is fed into the second video source 14 and supplied back to the SYNC-separator/genlocking apparatus 16 and the delay analyzer 18. In the delay analyzer 18, the pixel clock signal 28 actuates a counter (not shown) that measures the number of pixel clock cycles between the selected edge of C-SYNC and H-Blank. By selectively increasing or decreasing the duty cycle and effective gain of the digital pulse train 22 that is used to drive the low pass RC filter 24 feeding the voltage controlled oscillator (VCXO) 26, it is possible to control the delay relationship between the C-SYNC and H-Blank signals in a programmable fashion (described infra) to allow for adjustments based on specific application requirements and system configurations.

Figure 2:
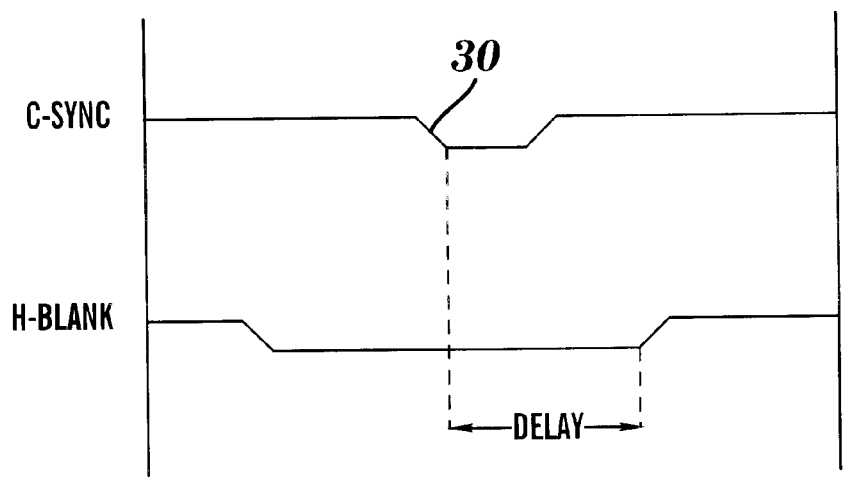
FIG. 2 illustrates the measurement of the delay between the leading edge of the C-SYNC signal and the H-Blank signal extracted by the SYNC-separator/genlocking apparatus.
Figure 3:
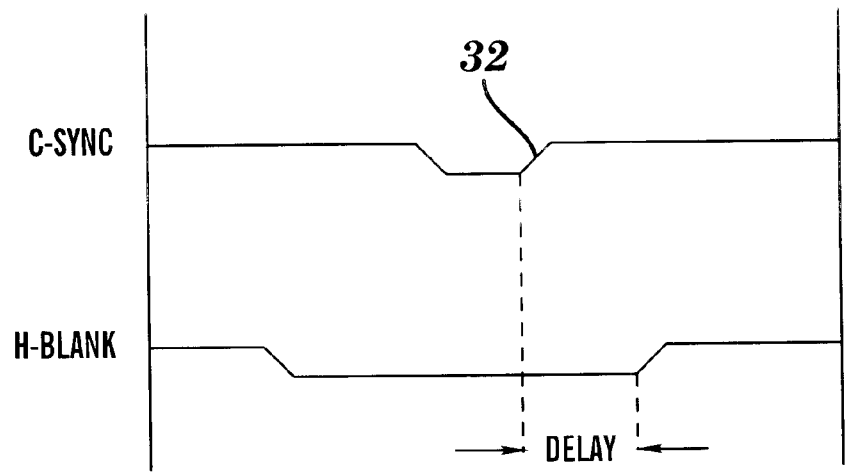
FIG. 3 illustrates the measurement of the delay between the trailing edge of the C-SYNC signal and the H-Blank signal extracted by the SYNC-separator/genlocking apparatus.

The delay measurement between an edge of the C-SYNC signal and the extracted H-Blank signal to determine the adjustment of the VCXO 26 is illustrated in FIGS. 2 and 3. In particular, FIG. 2 illustrates the measurement of the delay between a leading edge 30 of the C-SYNC signal and the H-Blank signal extracted by the SYNC-separator/ genlocking apparatus 16. Similarly, FIG. 3 illustrates the measurement of the delay between a trailing edge 32 of the C-SYNC signal and the H-Blank signal extracted by the SYNC-separator/genlocking apparatus 16.

The comparison result generated by the comparator circuit 20 is provided to a decision circuit 34. Based on the comparison result, the decision circuit 34 instructs a selection system 40 to either increase or decrease the duty cycle and effective gain of the digital pulse train 22 that drives the low pass RC filter 24. For example, in the case of the delay measurement being greater than the programmable delay target value, the comparison result provided by the comparator circuit 20 is used to increase the duty cycle and effective gain of the digital pulse train 22 into the low pass RC filter 24. In other words:

if measured_delay<program_selected_delay—
>increase duty and effective gain of digital pulse train to RC filter/VCXO.

In the case of the delay measurement being less than the programmable delay target value, the comparison result provided by the comparator circuit 20 is used to decrease the duty cycle and effective gain of the digital pulse train 22 into the low pass RC filter 24. In other words:

if measured_delay>program_selected_delay—
>decrease duty and effective gain of digital pulse train to RC filter/VCXO.

Depending on the type of VCXO that is used, the opposite may hold. Namely, if measured_delay<program_selected_delay—
<decrease duty and effective gain of digital pulse train to RC filter/VCXO; and if measured_delay>program_selected_delay—
>increase duty and effective gain of digital pulse train to RC filter/VCXO.

It should be noted that, based on the application, either the leading edge 30 or the trailing edge 32 of C-SYNC may be more stable, or have other desirable characteristics, and should therefore be selected, via programming control, as the edge to be compared to the extracted H-Blank signal in the delay analyzer 18. For example, as shown in FIG. 1, an edge select signal (ES) may be provided to the delay analyzer 18 to select either the leading edge 30 or the trailing edge 32 of C-SYNC for use in the delay measurement.

To allow for adjustability in the responsiveness (or effective gain) of the digital pulse train 22 used to drive the RC low pass filter 24 feeding the VCXO 26, the following methods may be used. For example, in one typical implementation of the present invention, a digital '1' is supplied to the low pass RC filter 24 when it is desired to increase the clock frequency of the pixel clock signal 28 driving the second video source 14, as a result of the delay measurement indicating a required increase in the duty cycle and effective gain of the digital pulse train 22. Similarly, a '0' could be supplied to the low pass RC filter 24 when it is desired to decrease the clock frequency of the pixel clock signal 28 driving the second video source 14, when a decrease in the duty cycle and effective gain of digital pulse train 22 is indicated. This scheme is effectively a duty of 100% for an increase and 0% for a decrease. This method alone, however, is highly reactive and may operate poorly in the presence of a noisy C-SYNC source. Alternatively, a less reactive duty of 75% could be supplied to the low pass RC filter 24 for an increase, and 25% for a decrease. This scheme, however, may allow for an unacceptable amount of drift in an environment where the source of C-SYNC is very stable.

Figure 4:
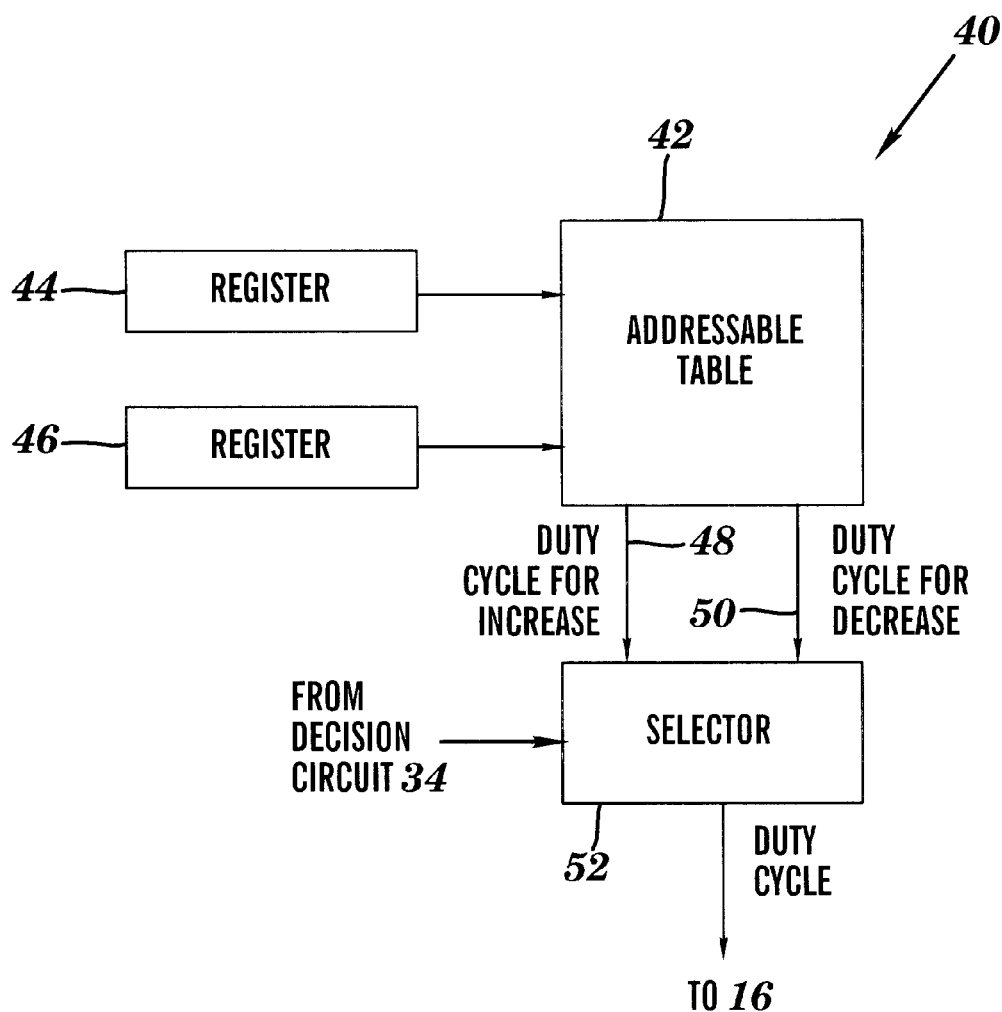
FIG. 4 illustrates a system for programmably selecting the duty cycle and effective gain of the digital pulse train, to increase or decrease the clock frequency of the pixel clock signal supplied to the second video source, in accordance with a preferred embodiment of the present invention.

The present invention provides for the programmable selection of the duty cycle and effective gain of the digital pulse train 22 feeding the VCXO 26 via the low pass RC filter 24. Advantageously, the duty cycle and effective gain of the digital pulse train 22 can now be optimized for a given environment and/or application. An example of a selection system 40 for programmably selecting the duty cycle and effective gain of the digital pulse train 22 is illustrated in FIG. 4.

An addressable table 42 is provided containing all possible desired values for the duty cycle and effective gain of the digital pulse train 22 that are to be supplied to the low pass RC filter 24 connected to the input of the VCXO 26. During operation, the system 40 writes a different address value into address registers 44, 46, which are coupled to the addressable table 42. The value written into the address register 44 corresponds to the address in the addressable table 42 containing the value of the duty cycle and effective gain to be selected when an increase in the clock frequency of the pixel clock signal 28 is required. Similarly, the value written into the address register 46 corresponds to the address in the addressable table 42 containing the value of the duty cycle and effective gain to be selected when a decrease in the clock frequency of the pixel clock signal 28 is required. The selected duty cycle and effective gain values corresponding to an increase and decrease in the clock frequency of the pixel clock signal 28, are available at the outputs 48, 50, respectively, of the addressable table 42.

Based on the comparison result provided to the decision circuit 34 by the comparator circuit 20, the decision circuit 34 instructs a selector 52 to select one of the two outputs of the addressable table 42 to yield the appropriate duty cycle and effective gain value to be applied to the low pass RC filter 24 and VCXO 26. This allows for the independent selection of both the increment and decrement duty cycle and effective gain values, based on specific application requirements and system configurations.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. An apparatus comprising:
   a first video source for providing a composite sync signal (C-SYNC);
   a sync separator for extracting a horizontal sync signal (H-Blank) and a vertical sync signal (V-SYNC) from C-SYNC;
   a system for measuring a delay between an edge of C-SYNC and H-Blank;
   a comparator for comparing the measured delay with a programmable target delay value;
   a pixel clock system for generating a pixel clock signal for a second video source, the second video source additionally receiving H-Blank and V-SYNC; and
   a system for programmably controlling a duty cycle and effective gain of a digital signal provided to the pixel clock system, based on the comparison result provided by the comparator.

2. The apparatus of claim 1, wherein the delay between H-Blank and C-SYNC is provided without the use of fixed delay elements.

3. The apparatus of claim 1, wherein the system for measuring the delay between the edge of C-SYNC and H-Blank receives an edge select signal to select either a leading or a trailing edge of C-SYNC for use in the delay measurement.

4. The apparatus of claim 1, wherein the pixel clock system further comprises:
   a low pass RC filter and a voltage controlled oscillator, wherein the voltage controlled oscillator generates the pixel clock signal.

5. The apparatus of claim 1, wherein the digital signal provided to the pixel clock system comprises a digital pulse train.

6. The apparatus of claim 1, wherein the system for programmably controlling the duty cycle and effective gain of the digital signal provided to the pixel clock system changes the duty cycle and effective gain of the digital signal if the comparator output indicates that the measured delay is less than the programmable target delay value.

7. The apparatus of claim 1, wherein the system for programmably controlling the duty cycle and effective gain of the digital signal provided to the pixel clock system changes the duty cycle and effective gain of the digital signal if the comparator output indicates that the measured delay is greater than the programmable target delay value.

8. The apparatus of claim 1, wherein the system for programmably controlling the duty cycle and effective gain of the digital signal provided to the pixel clock system further includes:
   a selection system for independently providing a first duty cycle and effective gain for the digital signal and a second duty cycle and effective gain for the digital signal, and wherein the selection system selects either the first duty cycle and effective gain or the second duty cycle and effective gain based on the output of the comparator.

9. The apparatus of claim 8, wherein the selection system further includes:
   an addressable table for storing a plurality of possible values for the duty cycle and effective gain of the digital signal;
   first and second address registers for storing address values corresponding to locations in the addressable table containing the first duty cycle and effective gain and the second duty cycle and effective gain, respectively.
   a selector for selecting either the first duty cycle and effective gain or the second duty cycle and effective gain based on the output of the comparator.

10. A method comprising the steps of:
   providing a composite sync signal (C-SYNC) from a first video source;
   extracting a horizontal sync signal (H-Blank) and a vertical sync signal (V-SYNC) from C-SYNC;
   measuring a delay between an edge of C-SYNC and H-Blank;
   comparing the measured delay with a programmable target delay value;
   generating a pixel clock signal for a second video source, the second video source additionally receiving H-Blank and V-SYNC; and
   programmably controlling a duty cycle and effective gain of a digital signal provided to the pixel clock system, based on the result of the comparison step.

11. The method of claim 10, wherein the delay between H-Blank and C-SYNC is provided without the use of fixed delay elements.

12. The method of claim 10, wherein the step of measuring a delay between an edge of C-SYNC and H-Blank further includes the step of:

providing an edge select signal to select either a leading or a trailing edge of C-SYNC for use in the delay measurement.

13. The method of claim 10, wherein the step of generating a pixel clock signal further comprises the step of:

providing a low pass RC filter and a voltage controlled oscillator, wherein the voltage controlled oscillator generates the pixel clock signal.

14. The method of claim 10, wherein the digital signal provided to the pixel clock system comprises a digital pulse train.

15. The method of claim 10, wherein the step of programmably controlling the duty cycle and effective gain of the digital signal provided to the pixel clock system further includes the step of:

changing the duty cycle and effective gain of the digital signal if the result of the comparison step indicates that the measured delay is less than the programmable target delay value.

16. The method of claim 10, wherein the step of programmably controlling the duty cycle and effective gain of the digital signal provided to the pixel clock system further includes the step of:

changing the duty cycle and effective gain of the digital signal if the result of the comparison step indicates that the measured delay is greater than the programmable target delay value.

17. The method of claim 10, wherein the step of programmably controlling the duty cycle and effective gain of the digital signal provided to the pixel clock system further includes the steps of:

independently providing a first duty cycle and effective gain for the digital signal and a second duty cycle and effective gain for the digital signal; and selecting either the first duty cycle and effective gain or the second duty cycle and effective gain based on the result of the comparison step.

18. The method of claim 17, wherein the selecting step further includes the steps of:

storing a plurality of possible values for the duty cycle and effective gain of the digital signal in an addressable table;

storing, in first and second address registers, address values corresponding to locations in the addressable table containing the first duty cycle and effective gain and second duty cycle and effective gain, respectively, and selecting either the first duty cycle and effective gain or the second duty cycle and effective gain based on the result of the comparison step.

19. The method of claim 10, wherein the delay measuring step receives the pixel clock signal, and wherein the delay is measured in terms of the number of clock cycles between the edge of C-SYNC and H-Blank.

\* \* \* \* \*